US008159310B2

(12) United States Patent
Park et al.

(10) Patent No.: US 8,159,310 B2
(45) Date of Patent: Apr. 17, 2012

(54) MICTOSTRIP TRANSMISSION LINE STRUCTURE WITH VERTICAL STUBS FOR REDUCING FAR-END CROSSTALK

(75) Inventors: Hong June Park, Pohang-si (KR); Jae Yoon Sim, Pohang-si (KR); Kyoung Ho Lee, Pohang-si (KR); Seon Kyoo Lee, Seoul (KR)

(73) Assignee: Postech Academy - Industry Foundation, Pohang-Si (KR)

( * ) Notice: Subject to any disclaimer, the term of this patent is extended or adjusted under 35 U.S.C. 154(b) by 128 days.

(21) Appl. No.: 12/673,747

(22) PCT Filed: Mar. 3, 2008

(86) PCT No.: PCT/KR2008/001204

§ 371 (c)(1),
(2), (4) Date: Feb. 16, 2010

(87) PCT Pub. No.: WO2009/028774

PCT Pub. Date: Mar. 5, 2009

(65) Prior Publication Data

US 2011/0090028 A1 Apr. 21, 2011

(30) Foreign Application Priority Data

Aug. 24, 2007 (KR) ........................ 10-2007-0085300

(51) Int. Cl.
*H03H 7/38* (2006.01)
*H01P 3/08* (2006.01)

(52) U.S. Cl. ................................ 333/1; 333/33; 333/246

(58) Field of Classification Search .................... 333/33, 333/238, 246, 1, 4, 5
See application file for complete search history.

(56) References Cited

U.S. PATENT DOCUMENTS

2002/0070824 A1 6/2002 Nitta
2004/0134683 A1 7/2004 Festag et al.
2007/0268088 A1 * 11/2007 Singh ............................. 333/33

FOREIGN PATENT DOCUMENTS

JP 2000-004108 A 1/2000
KR 100744535 B1 7/2007

OTHER PUBLICATIONS

PCT International Search Report of International Application No. PCT/KR2008/001204.
PCT Written Opinion of the International Search Authority for International Application No. PCT/KR2008/001204.

* cited by examiner

*Primary Examiner* — Stephen Jones
(74) *Attorney, Agent, or Firm* — Kile Park Goekjian Reed & McManus PLLC

(57) ABSTRACT

Provided is a microstrip transmission line for reducing far-end crosstalk. In a conventional microstrip transmission line on a printed circuit board, a capacitive coupling between adjacent signal lines is smaller than an inductive coupling therebetween, so that far-end crosstalk occurs. According to the present invention, the capacitive coupling between the adjacent signal lines is increased to reduce the far-end crosstalk. A vertical-stub type microstrip transmission line is provided.

7 Claims, 8 Drawing Sheets

MICTOSTRIP TRANSMISSION LINE STRUCTURE WITH VERTICAL STUBS FOR REDUCING FAR-END CROSSTALK

BACKGROUND OF THE INVENTION

1. Field of the Invention

In addition, by increasing on The present invention relates to a microstrip transmission line structure with vertical stubs for reducing far-end crosstalk, and more particularly, to a microstrip transmission line structure capable of reducing far-end crosstalk that occurs due to an electromagnetic coupling between adjacent transmission lines when several high-speed signals are transmitted through a microstrip transmission line.

According to the present invention, vertical stub structures for increasing a mutual capacitance are added to microstrip line transmission lines to reduce far-end crosstalk. Accordingly, without using a guard trace for a high-speed system having a limited area of a printed circuit board or increasing a distance between two signal lines, far-end crosstalk can be effectively reduced, so that the area of the printed circuit board can be decreased, and costs can be reduced.

In addition, by increasing only the mutual capacitance while maintaining a mutual inductance, jitter that occurs due to a difference between transmission times in the even and odd modes can be reduced, so that a signal transmission speed can be increased.

2. Description of the Related Art

Far-end crosstalk is caused by an electromagnetic coupling between signal lines and may generate timing jitter when high-speed signals are transmitted, so that the far-end crosstalk becomes a problem with increasing a signal rate. The Far-end crosstalk occurs due to a difference between a capacitive coupling caused by a mutual capacitance and an inductive coupling caused by a mutual inductance.

FIG. 1 is a view illustrating a conventional microstrip transmission line structure. In FIG. 1, two parallel microstrip transmission lines are illustrated. Ends of the transmission lines are terminated with resistors having the same value as a characteristic impedance.

The transmission line having an end (transmitting end) applied with a signal is referred to as an aggressor line 10, and the transmission line having an end that is not applied with a signal is referred to as a victim line 20. Far-end crosstalk $V_{FEXT}$ of the victim line 20 may be represented by Equation 1.

$$V_{FEXT}(t) = \frac{TD}{2} \cdot \left(\frac{C_m}{C_T} - \frac{L_m}{L_S}\right) \cdot \frac{\partial V_a(t - TD)}{\partial t} \quad \text{[Equation 1]}$$

Here, TD denotes a transmission time for which a signal is transmitted along a transmission line, $C_m$ denotes a mutual capacitance per unit length, $C_T$ denotes a sum of a self-capacitance and the mutual capacitance per unit length, $L_m$ denotes a mutual inductance per unit length, $L_S$ denotes a self-inductance per unit length, and $V_a(t)$ denotes a voltage applied to a transmitting end of the aggressor line.

In a transmission line disposed in a homogeneous medium such as a stripline, the capacitive coupling and the inductive coupling have the same value, so that ideally, far-end crosstalk becomes 0.

However, in a microstrip line manufactured on a printed circuit board, the inductive coupling is greater than the capacitive coupling, so that the far-end crosstalk has a negative value.

The far-end crosstalk of the stripline transmission line can be removed. However, to do this, the stripline transmission line uses a larger number of layers of the printed circuit board as compared with the microstrip line, and this requires additional costs.

When individual signals are applied to the two parallel microstrip lines, a case where the two applied signals are changed in the same direction with respect to time is called an even mode, and a case where the two applied signals are changed in the opposite directions to each other with respect time is called an odd mode.

FIG. 2 is a conceptual diagram of the even mode and the odd mode. When an applied signal increases with respect to time, the far-end crosstalk has a negative pulse. Therefore, in the even mode, the far-end crosstalk delays the change in the signal with respect to the time, and in the odd mode, the far-end crosstalk reinforces the change in the signal with respect to time.

Therefore, a signal transmission time is slightly increased in the even mode and slightly decreased in the odd mode. A difference between the transmission times of the even and the odd modes may be represented by Equation 2 as follows.

$$TD_{EVEN} - TD_{ODD} = l\sqrt{L_S C_T}\left(\frac{L_m}{L_S} - \frac{C_m}{C_T}\right) \quad \text{[Equation 2]}$$

Here, l denotes a length of the transmission line, $TD_{EVEN}$ denotes the even mode transmission time, $TD_{ODD}$ denotes the transmission time in the odd mode, $C_m$ denotes a mutual capacitance per unit length, $C_T$ denotes a sum of a self-capacitance and the mutual capacitance per unit length, $L_m$ denotes a mutual inductance per unit length, and $L_S$ is a self-inductance per unit length.

When random data signals are applied to transmitting ends of two parallel microstrip transmission lines, due to a difference between signal arrival times in the even and the odd modes, times at which the data signals rise are different at receiving end. In other words, timing jitter occurs. This phenomenon is illustrated by dotted lines in FIG. 3.

In order to reduce the far-end crosstalk effects in the microstrip transmission line, distances between signal lines are increased, or guard traces are used. The guard trace is referred to as a structure in which a parallel trace is added between adjacent two signal lines to reduce a coupling between the two signal lines. However, the aforementioned methods require large areas of the printed circuit board.

SUMMARY OF THE INVENTION

The present invention provides a microstrip transmission line structure with vertical stubs for effectively reducing far-end crosstalk by increasing a mutual capacitance between adjacent signal lines.

The present invention also provides a microstrip transmission line structure with vertical stubs for effectively reducing far-end crosstalk that occurs in microstrip transmission line when a capacitive coupling is smaller than an inductive coupling, by increasing the capacitive coupling while maintaining the inductive coupling.

According to an aspect of the present invention, there is provided a microstrip transmission line structure with vertical stubs for reducing far-end crosstalk including: a first microstrip transmission line; a second microstrip transmission line which is distance from and parallel to the first microstrip transmission line; and a number of stubs formed at the first and second microstrip transmission lines to increase a mutual capacitance. In the above aspect of the present invention, first, second, fifth, and sixth stubs formed at the first microstrip transmission line may be disposed to be perpendicular to a length direction of the first microstrip transmission line, and third, fourth, seventh, and eighth stubs formed at the second microstrip transmission line may be disposed to be perpendicular to a length direction of the second microstrip transmission line.

In addition, the second stubs formed at the first microstrip transmission line and the third stubs formed at the second microstrip transmission line may be alternately disposed so as not to face each other at the same positions in the length direction of the first or second microstrip transmission line.

In addition, the fourth stubs may be disposed at the second microstrip transmission line to extend in such a direction to be far from the first microstrip transmission line and disposed at the same positions as the second stubs disposed at the first microstrip transmission line along the length direction of the transmission line, and the first stubs may be disposed at the first microstrip transmission line to extend in such a direction to be far from the second microstrip transmission line and disposed at the same positions as the third stubs disposed at the second microstrip transmission line along the length direction of the transmission line.

In addition, a third microstrip transmission line which is disposed at a side of the first microstrip transmission line to be parallel thereto in the opposite direction of the second microstrip transmission line may further be included, and the third microstrip transmission line includes a number of stubs, so that extensibility can be improved.

BRIEF DESCRIPTION OF THE DRAWINGS

FIG. 4*a* is a view illustrating a structure in which intervals between the vertical stubs are uniform according to a first embodiment of the present invention.

FIG. 4*b* is a view illustrating a structure in which adjacent two vertical stubs are grouped as a unit according to a second embodiment of the present invention.

FIG. 7*a* is an eye diagram according to a conventional art.

FIG. 7*b* is an eye diagram according to the present invention.

DETAILED DESCRIPTION OF THE INVENTION

Hereinafter, exemplary embodiments of the present invention will be described in detail with reference to the attached drawings.

Figure 4:
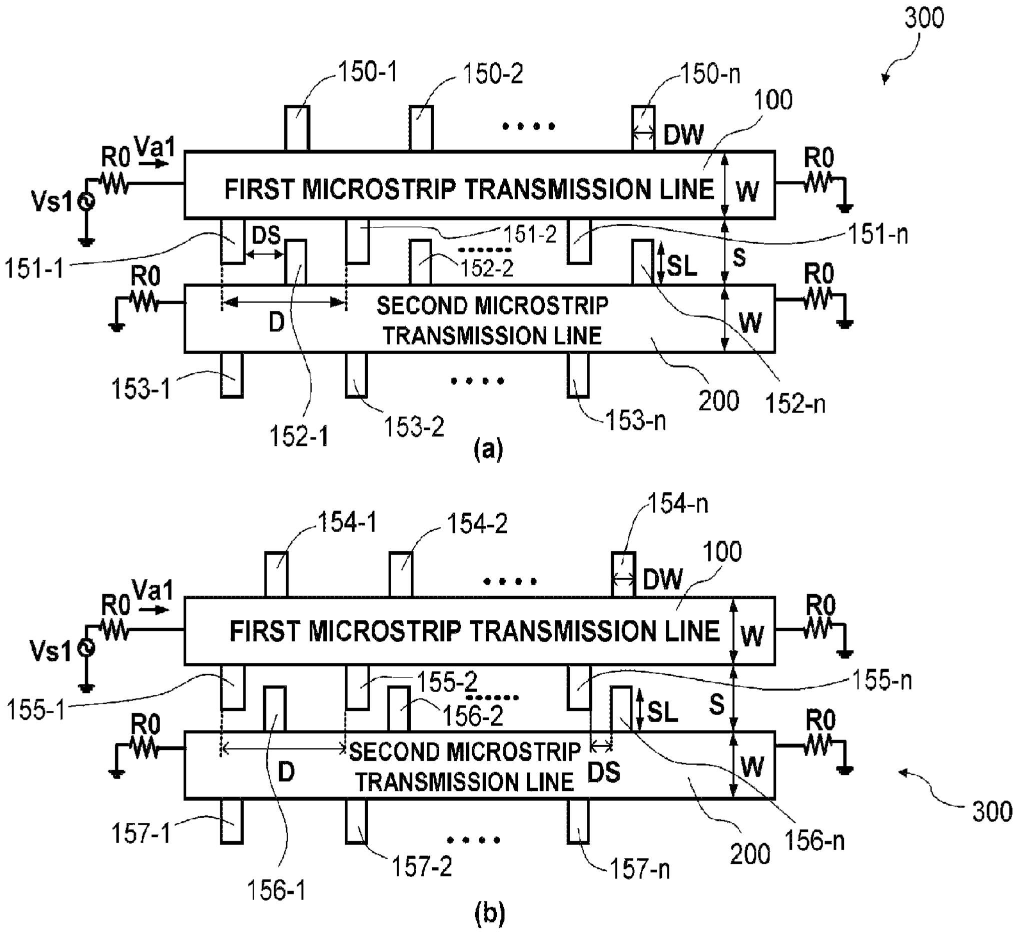
FIG. 4 is a view illustrating microstrip transmission line structures with vertical stubs according to the present invention.

FIG. 4 is a view illustrating a microstrip transmission line structure with vertical stubs for reducing far-end crosstalk according to the present invention. Here, FIG. 4*a* illustrates a case where intervals between stubs formed at a first microstrip transmission line that functions as an aggressor line and stubs formed at a second microstrip transmission line that functions as a victim line are uniform according to a first embodiment of the present invention. FIG. 4*b* illustrates a case where an interval between a stub formed at a first microstrip transmission line and a stub formed at a second microstrip transmission line are disposed at a minimum interval according to a second embodiment of the present invention.

As illustrated in FIGS. 4*a* and 4*b*, a microstrip transmission line structure 300 with vertical stubs for reducing far-end crosstalk according to the present invention includes a first microstrip transmission line 100, a second microstrip transmission line 200 which is distant from and parallel to the first microstrip transmission line 100, and a number of vertical stubs formed at the first and second microstrip transmission lines 100 and 200 to increase a mutual capacitance between the first and second microstrip transmission lines 100 and 200. Here, the vertical stubs according to the current embodiment include first to eighth stubs 150-1 to 150-*n*, 151-1 to 151-*n*, 152-1 to 152-*n*, 153-1 to 153-*n*, 154-1 to 154-*n*, 155-1 to 155-*n*, 156-1 to 156-*n*, and 157-1 to 157-*n* which are vertically formed at both sides of the microstrip transmission lines.

Here, the first microstrip transmission line 100 is the aggressor line, and the second microstrip transmission line 200 is the victim line.

In addition, the first, second, fifth, and sixth stubs 150-1 to 150-*n*, 151-1 to 151-*n*, 154-1 to 154-*n*, and 155-1 to 155-*n* formed at the first microstrip transmission line 100 are disposed to be perpendicular to a length direction of the first microstrip transmission line 200, and the third, fourth, seventh, and eight stubs 152-1 to 152-*n*, 153-1 to 153-*n*, 156-1 to 156-*n*, and 157-1~157-*n* formed at the second microstrip transmission line 200 are disposed to be perpendicular to a length direction of the second microstrip transmission line 200.

According to the first embodiment of the present invention illustrated in FIG. 4*a*, the second stubs 151-1 to 151-*n* formed at the first microstrip transmission line 100 and the third stubs 152-1 to 152-*n* formed at the second microstrip transmission line 200 do not face each other at the same positions in the length directions of the first and second microstrip transmission lines 100 and 200 but are disposed in alternate positions in the length directions of the first and second microstrip transmission lines 100 and 200.

In addition, the fourth stubs 153-1 to 153-*n* are disposed at the second microstrip transmission line 200 to extend in such a direction to be far from the first microstrip transmission line 100. Here, the fourth stubs 153-1 to 153-*n* may be disposed at the same positions in the length direction of the transmission line as the second stubs 151-1 to 151-*n* that are disposed at the first microstrip transmission line 100 to face the second microstrip transmission line 200. Namely, the second and fourth stubs of the aggressor line and the victim line may extend in the same direction and are disposed at the same positions of the transmission lines, that is, at the same axes.

Similarly, the first stubs 150-1 to 150-*n* are disposed at the first microstrip transmission line 100 to extend in such a direction to be far from the second microstrip transmission line 200 and may extend in the same direction and the same axes as the third stubs 152-1 to 152-*n* that are disposed at the second microstrip transmission line 200 to face the first microstrip transmission line 100.

In addition, by controlling a transmission line length direction interval DS between the second stubs 151-1 to 151-*n* formed at the first microstrip transmission line 100 and the adjacent third stubs 152-1 to 152-*n* formed at the second microstrip transmission line 200, and a width DW and a length SL of the first to eight stubs 150-1 to 150-*n*, 151-1 to 151-*n*, 152-1 to 152-*n*, 153-1 to 153-*n*, 154-1 to 154-*n*, 155-1 to 155-*n*, 156-1 to 156-*n*, and 157-1 to 157-*n*, the mutual capacitance between the microstrip transmission lines can be controlled.

One of the third stubs 152-1 to 152-*n* formed at the second microstrip transmission line 200 is disposed at a side of one of the second stubs 151-1 to 151-*n* formed at the first microstrip transmission line 100, and another one of the second stubs 151-1 to 151-*n* formed at the first microstrip transmission line 100 is disposed at the other side of the one of the third stubs 152-1 to 152-*n*, so that a structure in which the second and third stubs are alternately disposed may be uniformly repeated in the length direction of the transmission line.

According to the second embodiment of the present invention as illustrated in FIG. 4*b*, an arrangement of the fifth to eighth stubs 154-1 to 154-*n*, 155-1 to 155-*n*, 156-1 to 156-*n*, and 157-1 to 157-*n* is similar to that of the first to fourth stubs 150-1 to 150-*n*, 151-1 to 151-*n*, 152-1 to 152-*n*, and 153-1~153-*n* described above. The seventh stubs 156-1 to 156-*n* that are formed at the second microstrip transmission line 200 are disposed to be adjacent to the sixth stubs 155-1 to 155-*n* formed at the first microstrip transmission line 100 at minimum intervals which are allowed in a manufacturing process in the length direction of the transmission line. A bundle structure including one of the sixth stubs 155-1 to 155-*n* and one of the seventh stubs 156-1 to 156-*n* as a bundle is uniformly repeated in the length direction of the transmission line.

Here, the transmission line length direction distance DS is determined so that a difference between a capacitive coupling ratio and an inductive coupling ratio is decreased in the structure in which the second and third stubs are repeatedly disposed at predetermined intervals and in the bundle structure including the sixth and seventh stubs that are disposed at the minimum intervals.

This is described in detail as follows.

According to the present invention, a microstrip transmission line structure which can effectively reduce the far-end crosstalk by using only signal lines without using a conventional guard trace or increasing a distance between the transmission lines, is provided.

Figure 1:
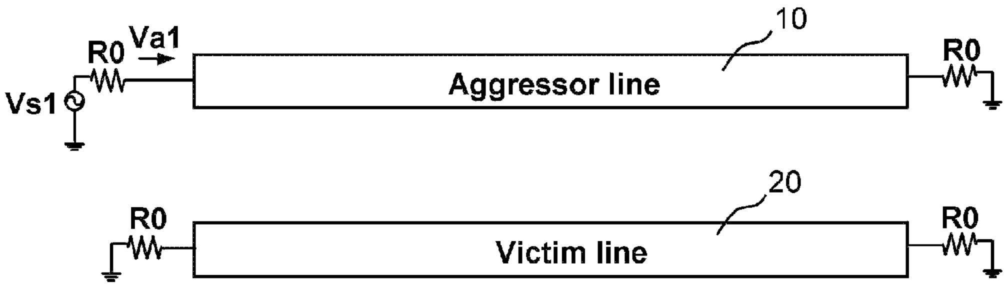
FIG.1 (PRIOR ART)
FIG. 1 is a view illustrating a conventional microstrip transmission line structure.
Figure 2:
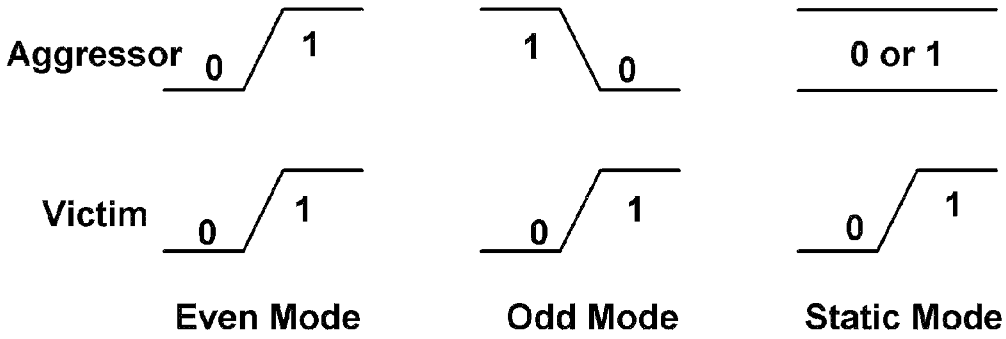
FIG. 2 (PRIOR ART)
FIG. 2 is a conceptual diagram of an even mode and an odd mode.
Figure 3:
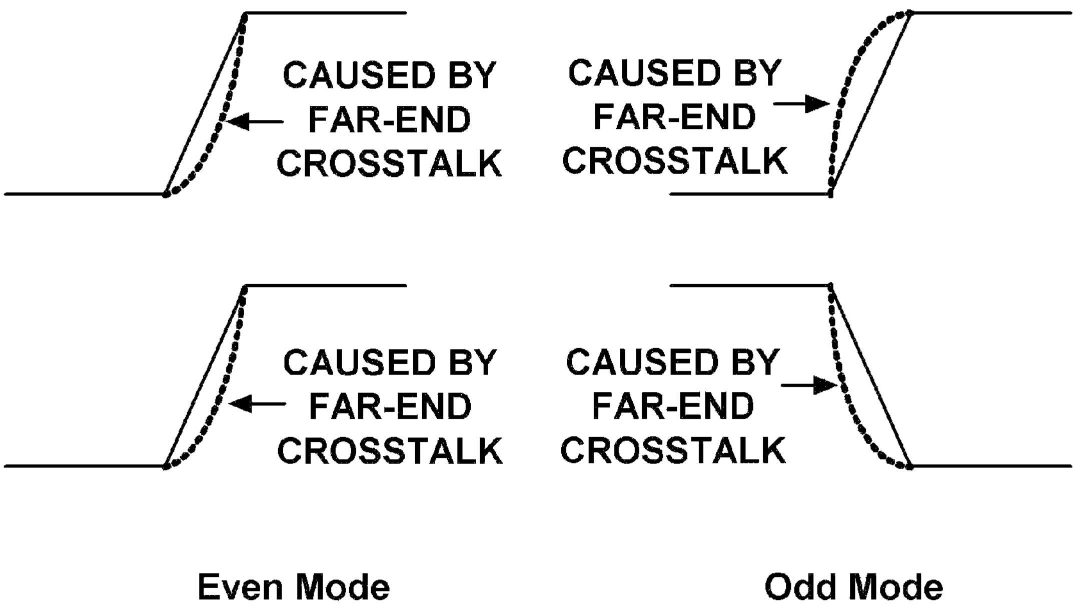
FIG. 3 (PRIOR ART)
FIG. 3 is a view illustrating effects of the far-end crosstalk in the even mode and the odd mode.

The conventional guard trace (not shown) is disposed between the aggressor line 10 and the victim line 20 illustrated in FIG. 1 to reduce the far-end crosstalk that occurs due to an electromagnetic interference of adjacent transmission lines when high-speed signals are transmitted through the transmission line on a printed circuit board.

As represented by Equations 1 and 2 that are described above, by decreasing a difference between the capacitive coupling and the inductive coupling, the far-end crosstalk and a difference between transmission times in the even and the odd modes can be reduced.

According to the present invention, by forming the stubs in a direction perpendicular to the microstrip transmission line to increase the mutual capacitance, the difference between the capacitive coupling and the inductive coupling decreases.

Specifically, according to the present invention, without the guard trace used in the conventional microstrip transmission line structure, the stubs in the vertical direction are added while two adjacent signal lines maintain a distance therebetween to increase a mutual capacitance there-between.

In addition, according to the present invention, the stubs formed at the two adjacent signal lines are alternately disposed in the transmission line length direction to increase the mutual capacitance. Here, the added stubs are perpendicular to a direction of a flowing current (the transmission line length direction), so that the mutual inductance does not greatly increased.

In addition, according to the present invention, when the stubs which face the victim line are formed at the aggressor line, stubs which face in the opposite direction to the aggressor line are formed at the victim line, so that an effective distance between two current distribution centers is increased as much as possible to prevent the mutual inductance from increasing.

Therefore, the microstrip transmission line according to the present invention employs the arrangement structure of the vertical stubs as illustrated in FIG. 4. Therefore, the mutual capacitance can be significantly increased while the mutual inductance is not significantly increased to reduce the far-end crosstalk and timing jitter that occurs due to the far-end crosstalk.

FIG. 4*a* is a view illustrating a case where intervals between the vertical stubs of the aggressor line and the victim line are uniform. FIG. 4*b* is a view illustrating a case where two vertical stubs of the aggressor line and the victim line are disposed at a minimum interval.

As the intervals between the stubs are decreased and the number of the stubs is increased, the capacitive coupling increases. Correspondingly, when the number of the stubs is increased too much, the capacitive coupling may be increased to be greater than the inductive coupling. In addition, as the number of the stubs increases, a self-capacitance value of the transmission line is increased, so that a characteristic impedance value of the transmission line is decreased.

Comparing FIG. 4*a* to FIG. 4*b*, when the numbers of the stubs are the same, the capacitive coupling in the case in FIG. 4*b* is greater than that in FIG. 4*a*. This is because a fringing electric field in the transmission line length direction is formed between the stubs. Therefore, in order to decrease the far-end crosstalk without significantly decreasing the characteristic impedance of the transmission line, the case in FIG. 4*b* is advantageous than that in FIG. 4*a*.

Figure 9:
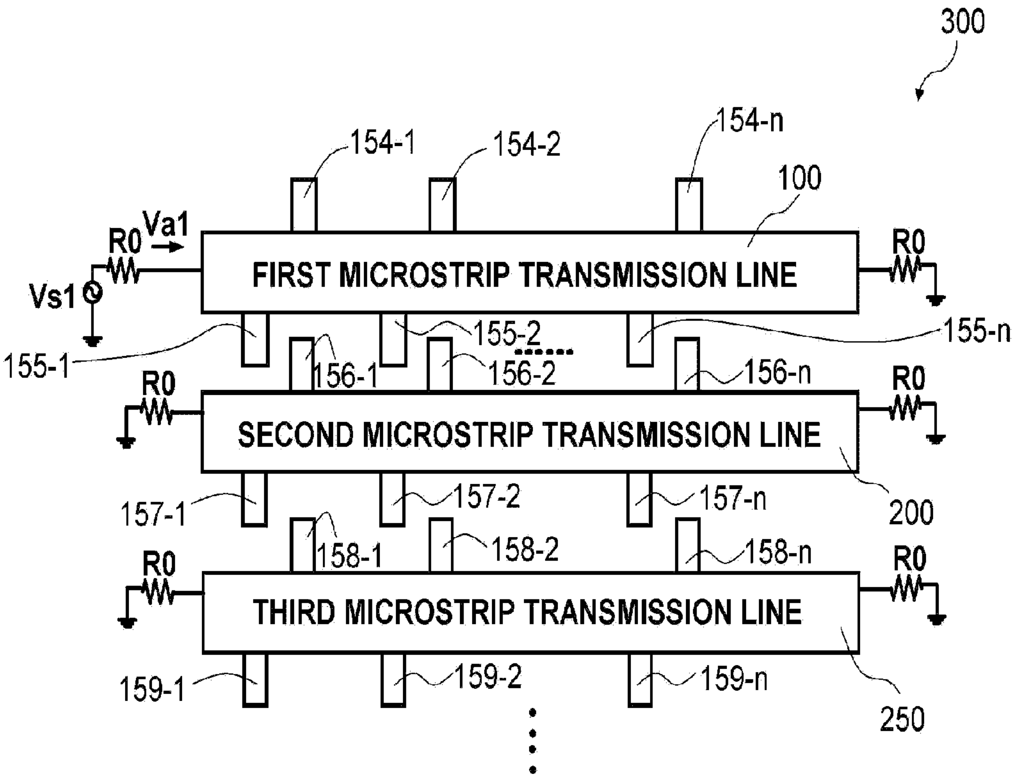
FIG. 9 is a view according to a third embodiment of the present invention.

In addition, according to a third embodiment of the present invention illustrated in FIG. 9, a third microstrip transmission line 250 which is disposed at a side of the first microstrip transmission line 100 to be parallel thereto in the opposite direction to the second microstrip transmission line 200 is further included. A number of stubs formed at the third microstrip transmission line 250 may be disposed at predetermined intervals as illustrated in FIG. 4*a* or disposed so that the stubs 158-1 to 158-*n* and 159-1 to 159-*n* have minimum intervals as illustrated in FIG. 4*b*. As described above, the microstrip transmission line structure with the vertical stubs according to the present invention may be extended by adding the transmission lines and the stubs.

Simulation results using the microstrip transmission line structure with the vertical stubs for reducing the far-end crosstalk according to the present invention are described.

According to the present invention, by using a self-inductance $L_S$ per unit length, a mutual inductance $L_m$ per unit length, a sum $C_T$ of a self-capacitance and a mutual capacitance per unit length, and the mutual capacitance $C_m$ per unit length which are calculated through a filed solver simulation, a difference between the capacitive coupling and the inductive coupling is calculated. As the field solver, the Ansoft high frequency structure simulator (HFSS) is used.

Here, as illustrated in FIG. 4_b_, when the stubs are disposed at the minimum intervals to be close to each other, a width W of the microstrip line and an interval S between the two transmission lines are 14 mil, the width DW of the stub is 5 mil or 14 mil, the length SL of the stub is 9 mil, and the interval DS between the stubs is 5 mil. According to the present invention, it is assumed that two-layer printed circuit board is used, and thicknesses of a dielectric and copper are 8 mil and 0.7 mil, respectively.

The values such as the interval, the width, and the thickness are simulation input values, and the intervals D between the two stubs formed at a side of the transmission line are input as a uniform value.

Figure 5:
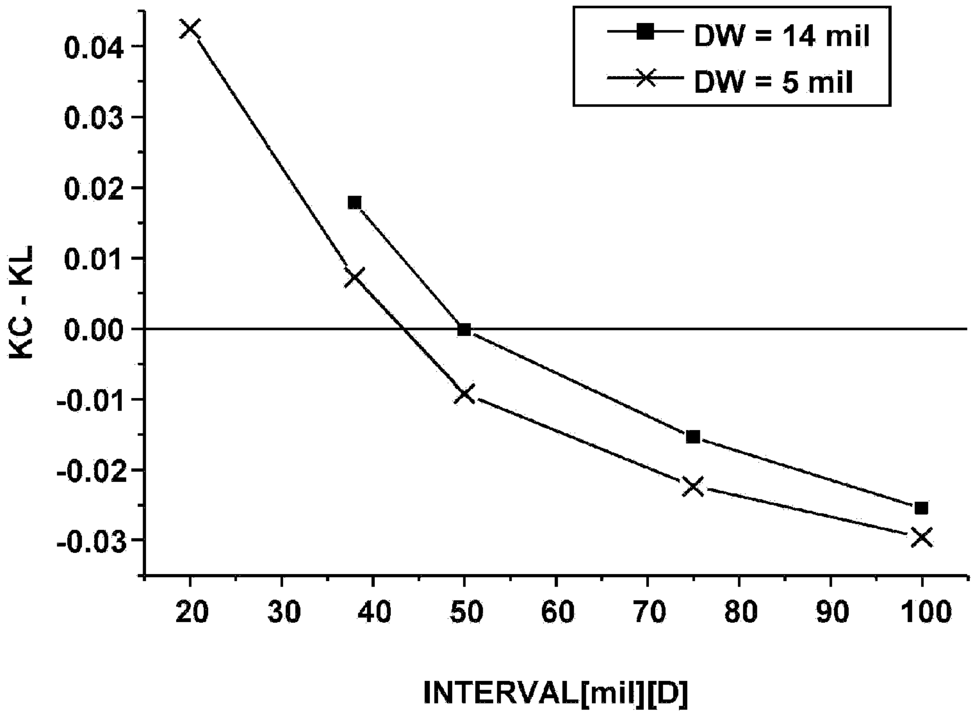
FIG. 5 is a graph illustrating a difference between a capacitive coupling ratio KC and an inductive coupling ratio KL with respect to a stub repeated interval D.

FIG. 5 is a view illustrating a difference between the capacitive coupling ratio ($KC=C_m/C_T$) and the inductive coupling ratio ($KL=L_m/L_S$) with respect to the interval D between the two stubs in the structure illustrated in FIG. 4_b_ when the width DW of the stub is 5 mil and the 14 mil.

In the structure illustrated in FIG. 4_b_, as the interval D between the two stubs is decreased, that is, the number of the stubs added per unit length is increased, the capacitive coupling is increased. In the case where the width of the stub that is the simulation input value is 14 mil, if the repeated interval D is 50 mil, the capacitive coupling is substantially the same as the inductive coupling. If the repeated interval D is smaller than 50 mil, according to a result of the simulation, the capacitive coupling becomes greater than the inductive coupling.

In addition, at the same interval D between the stubs which is the simulation input value, the capacitive coupling is larger in the case where the width of the stub is 14 mil. However, as the width of the stub is increased, the characteristic impedance of the transmission line is decreased.

A SPICE simulation is performed on the microstrip transmission line having the structure illustrated in FIG. 4_b_ by using the self-inductance $L_S$ per unit length, the mutual inductance $L_m$ per unit length, the sum $C_T$ of the self-capacitance and the mutual capacitance per unit length, and the mutual capacitance $C_m$ per unit length, which are calculated through the field solver.

Figure 6:
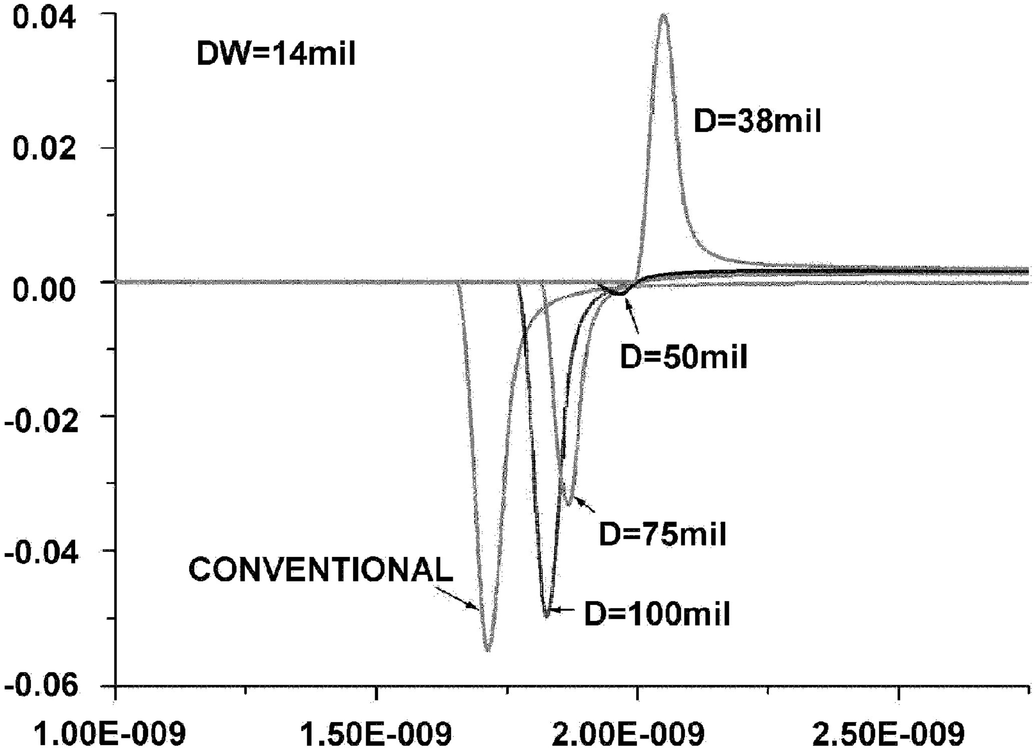
FIG. 6 is a graph illustrating changes in far-end crosstalk voltage waveforms according to repeated intervals D between the vertical stubs.

FIG. 6 is a graph illustrating far-end crosstalk voltage waveforms Vfext obtained by using the SPICE. A length of the microstrip line is 8 inch, and both terminals of all transmission lines have 50Ω terminal resistors having the same value as the transmission line characteristic impedance value.

A voltage of 0.4 V having a 50 ps rise time is applied to the aggressor line, and a far-end crosstalk voltage waveform is measured by the simulation at an end of the victim line. As compared with the conventional structure without the stubs, according to the present invention, the far-end crosstalk is reduced. Particularly, when the interval D between the stubs is 50 mil, the far-end crosstalk is substantially removed.

However, the stubs are added too much and the interval D between the stubs is 38 mil, the capacitive coupling becomes larger than the inductive coupling, and positive far-end crosstalk occurs.

In addition, the SPICE simulation is performed on the microstrip transmission structure illustrated in FIG. 4_b_ to measure timing jitter that occurs due to a difference between transmission times in the even and the odd modes.

Figure 7:
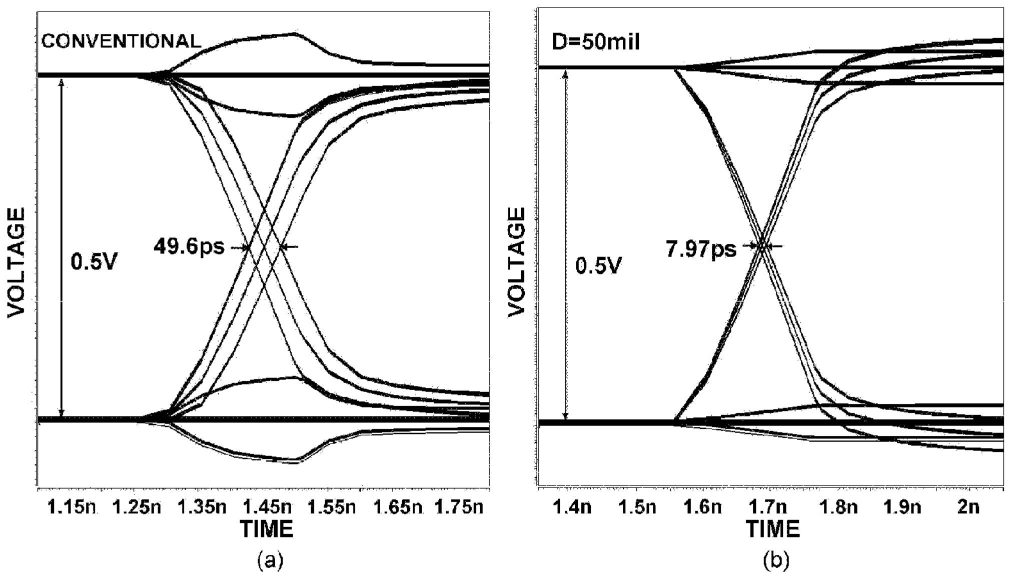
FIG. 7 is an eye diagram of a 100 Mbps pseudorandom binary sequence (PRBS).

FIGS. 7_a_ and 7_b_ illustrate eye diagrams according to the conventional art and the present invention. Here, values displayed in FIGS. 7_a_ and 7_b_ are simulation measurement values.

A pseudo random bit sequence pattern (PRBS) having the number of $2^7-1$ and a PRBS pattern having the number of $2^{15}-1$ are applied to the transmitting end of the aggressor line and the victim line, respectively, and waveforms are measured at a receiving end of the victim line.

As illustrated in FIG. 7_b_, when the interval D between the two stubs is 50 mil in the structure illustrated in FIG. 4_b_ according to the present invention, it can be seen in the eye diagrams that timing jitter takes 7.97 ps while timing jitter takes 49.6 ps according to the conventional art.

Figure 8:
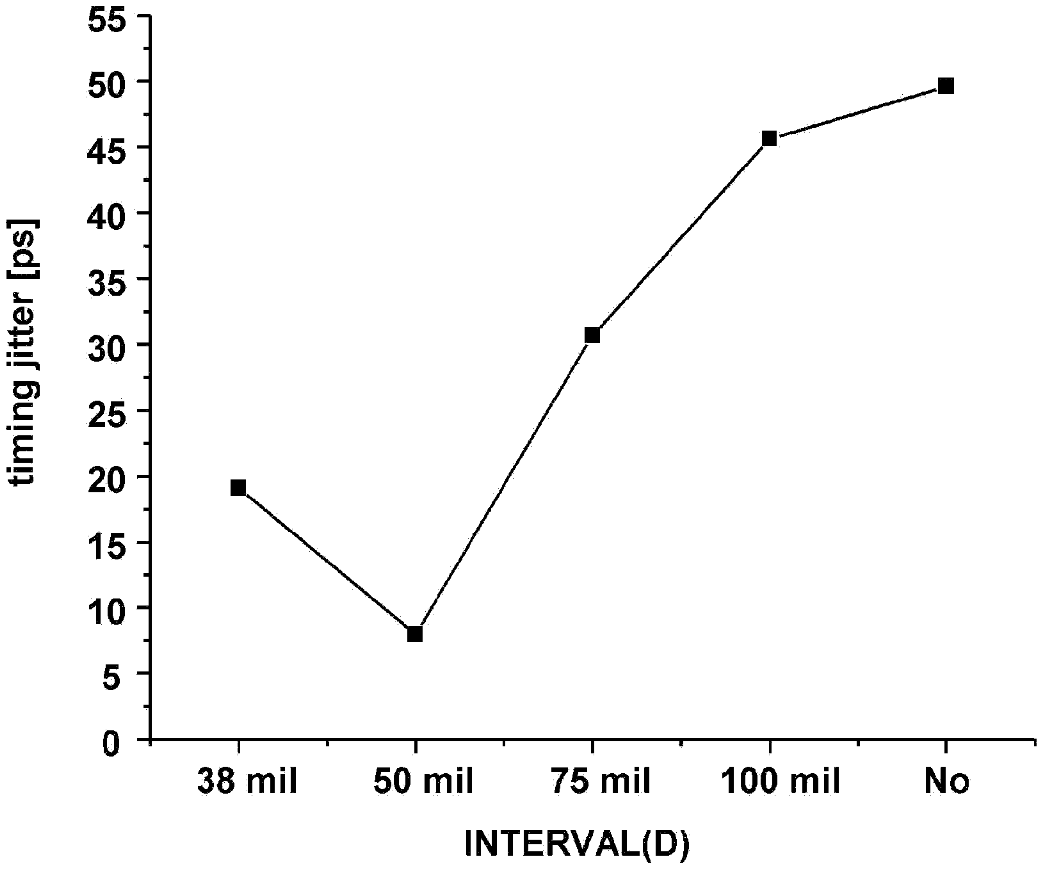
FIG. 8 is a graph illustrating timing jitter due to a difference between transmission times of the even mode and the odd mode.

FIG. 8 is a view illustrating timing jitter with respect to the interval D between the two stubs in the structure illustrated in FIG. 4_b_. As compared with the conventional art (a portion displayed as "No" in a transverse direction of the graph) without the stubs, timing jitter is significantly reduced according to the present invention. Particularly, similar to the far-end crosstalk voltage waveform, the timing jitter is minimized when the interval D between the stubs is 50 mil, and the timing jitter is increased when the interval D between the stubs is decreased to be smaller than 50 mil. This is because the capacitive coupling is increased too much to be greater than the inductive coupling.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A microstrip transmission line structure with vertical stubs for reducing far-end crosstalk including:

a first microstrip transmission line;

a second microstrip transmission line which is distance from and parallel to the first microstrip transmission line; and a number of stubs formed at the first and second microstrip transmission lines to increase a mutual capacitance, wherein first, second, fifth, and sixth stubs formed at the first microstrip transmission line are disposed to be perpendicular to a length direction of the first microstrip transmission line, and third, fourth, seventh, and eighth stubs formed at the second microstrip transmission line are disposed to be perpendicular to a length direction of the second microstrip transmission line, wherein the second stubs formed at the first microstrip transmission line and the third stubs formed at the second microstrip transmission line are alternately disposed so as not to face each other at the same positions in the length direction of the first or second microstrip transmission line, wherein the fourth stubs are disposed at the second microstrip transmission line to extend in such a direction to be far from the first microstrip transmission line and disposed at the same positions as the second stubs disposed at the first microstrip transmission line along the length direction of the transmission line, and wherein the first stubs are disposed at the first microstrip transmission line to extend in such a direction to be far from the second microstrip transmission line and disposed at the same positions as the third stubs disposed at the second microstrip transmission line along the length direction of the transmission line.

2. The structure of claim 1, wherein the mutual capacitance is controlled by controlling a transmission line length direction interval DS between a second stub formed at the first microstrip transmission and an adjacent third stub formed at the second microstrip transmission line, a width DW of the first to eight stubs, and a length SL of the stubs.

3. The structure of claim 1, further comprising a third microstrip transmission line which is disposed at a side of the first microstrip transmission line to be parallel thereto in the opposite direction of the second microstrip transmission line, wherein the third microstrip transmission line includes a number of stubs.

4. The structure of claim 1, wherein a third stub formed at the second microstrip transmission line is disposed at a side of a second stub formed at the first microstrip transmission line and another second stub formed at the first microstrip transmission line is disposed at the other side of the third stub so that a structure in which the second and third stubs are alternately disposed is uniformly repeated along the length direction of the transmission line.

5. The structure of claim 4, wherein the transmission line length direction interval DS between the stubs is determined so that a difference between a capacitive coupling ratio and an inductive coupling ratio is decreased in the repeatedly arranged structure including the second and third stubs or in the repeated stub bundle structure including the sixth and seventh stubs.

6. The structure of claim 1, wherein a sixth stub formed at the first microstrip transmission line and an adjacent seventh stub formed at the second microstrip transmission line are disposed at a minimum interval that is allowed in a manufacturing process along the length direction of the transmission line, and wherein a bundle structure including the sixth stub and the seventh stub as a bundle is uniformly repeated along the length direction of the transmission line.

7. The structure of claim 6, wherein the transmission line length direction interval DS between the stubs is determined so that a difference between a capacitive coupling ratio and an inductive coupling ratio is decreased in the repeatedly arranged structure including the second and third stubs or in the repeated stub bundle structure including the sixth and seventh stubs.

* * * * *